United States Patent [19]
Nguyen

[11] Patent Number: 6,144,894
[45] Date of Patent: Nov. 7, 2000

[54] METHOD OF ACTIVATING A MAGNETRON GENERATOR WITHIN A REMOTE PLASMA SOURCE OF A SEMICONDUCTOR WAFER PROCESSING SYSTEM

[75] Inventor: Tam Nguyen, Fremont, Calif.

[73] Assignee: Applied Materials, Inc., Santa Clara, Calif.

[21] Appl. No.: 09/023,330

[22] Filed: Feb. 13, 1998

[51] Int. Cl.$^7$ .................................................... G06F 19/00
[52] U.S. Cl. ........................... 700/121; 700/123; 62/480; 102/200; 102/202.2
[58] Field of Search ............................... 700/1, 121, 123; 438/710, 727, 706; 62/480, 497, 148; 315/39.51, 39.53, 111.21, 111.41; 340/825.06, 426; 102/200, 202.2

[56] References Cited

U.S. PATENT DOCUMENTS

| | | | |
|---|---|---|---|
| 5,002,632 | 3/1991 | Loewenstein et al. | 438/710 |
| 5,306,379 | 4/1994 | Kamide | 156/345 |
| 5,489,362 | 2/1996 | Steinhardt et al. | 438/727 |
| 5,508,227 | 4/1996 | Chan et al. | 438/798 |

OTHER PUBLICATIONS

Tai, "A Fundamental Theorem On The Maximum Frequency Of Coherent Oscillations By Robert S. Elliott", IEEE, pp. 802, 1992.

Ayres et al., "Universal Scaling And Initial Energy Distribution For Magneton", IEEE, pp. 180, 1990.

Primary Examiner—William Grant
Assistant Examiner—McDieunel Marc
Attorney, Agent, or Firm—Thomason Moser Patterson

[57] ABSTRACT

A method for controlling the output power of the magnetron generator, where the method and apparatus defines an ignition power level that ensures that the magnetron generator provides a minimal level of power that will ignite the plasma and not result in a detrimental impedance mismatch between the magnetron and an applicator of a remote plasma source. When the user of the wafer processing system requests a power level (i.e., a requested power level) that is below this ignition level, the ignition level is used to ignite the plasma and the output power of the magnetron is gradually decreased to the requested power level. The decrease is performed within a predetermined time period.

13 Claims, 3 Drawing Sheets

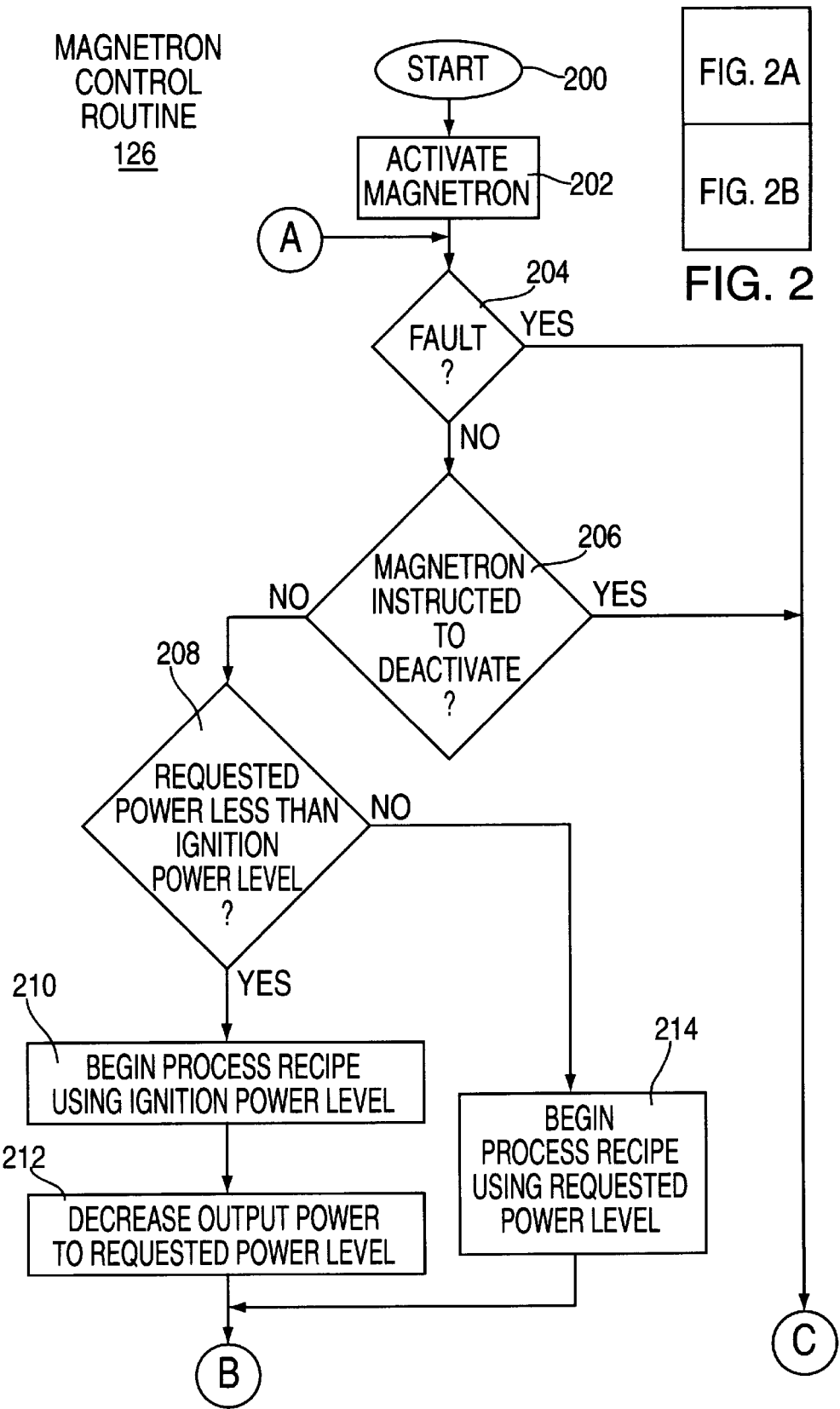

METHOD OF ACTIVATING A MAGNETRON GENERATOR WITHIN A REMOTE PLASMA SOURCE OF A SEMICONDUCTOR WAFER PROCESSING SYSTEM

BACKGROUND OF THE DISCLOSURE

1. Field of the Invention

The invention relates to a semiconductor wafer processing system having remote plasma source. More particularly, the invention relates to a method for initiating and controlling an amount of power applied to a plasma within a remote plasma source (RPS).

2. Description of the Background Art

Dry etch processes are well known in the art of semiconductor manufacturing, and are used to remove material from a semiconductor wafer using a gas or vapor as the etchant. In a dry etch system, a process gas is exposed to an electromagnetic field to convert the process gas into a plasmatic state. The use of plasma is advantageous to etch processes because the energetic plasma facilitates rapid etching. In an etch system having a remote plasma source, the plasma is generated in a chamber that is separate from the process chamber wherein the semiconductor wafer is located. The plasma chamber (also known as an applicator) is driven with microwave energy (e.g., 2.5 GHz at 1500 watts) generated by a microwave source such as a magnetron. The plasma chamber and the process chamber are coupled to one another by a conduit. In this manner, the wafer is not exposed to the electromagnetic fields that produce the plasma. The amount of plasma used at any given time is controlled by controlling 1) the amount of process gas released into the electromagnetic field within the plasma chamber, and 2) the amount of electromagnetic energy this process gas is exposed to within the plasma chamber.

In presently available systems, a user selects a power level to be used to ignite and maintain the plasma. Unfortunately, the user could request a magnetron power that is too low to ignite a plasma. The prior art systems generally refuse to activate the magnetron power level that is deemed too low.

Therefore, there is a need in the art for a method and apparatus that allows the plasma to be used at power levels that heretofore were considered "too low" by igniting a plasma at a safe power level and then adjusting the power to a user defined level.

SUMMARY OF THE INVENTION

The disadvantages associated with the prior art are overcome by the present invention. The invention utilizes a power controller to control the output power of the magnetron. The controller defines an ignition power level that ensures that the magnetron generator provides a minimal level of power that will ignite the plasma. The value of the ignition level is adjustable, and is defined by the physical limitations of the plasma chamber. When the user of the wafer processing system requests a power level (i.e., a requested power level) that is below this ignition level, the ignition level is used to ignite the plasma and the output power of the magnetron is gradually decreased to the requested power level. The decrease is performed within a predetermined time period.

More specifically, the method of the present invention first checks to ensure that there are no error conditions which would require termination of the process recipe. Then, if the requested power level is below the ignition level, the process recipe is permitted to begin, but the initial power supplied by the magnetron generator is established at the ignition level. The output power of the magnetron is then linearly decreased from the ignition level, within the predetermined time period, to the requested power level.

Consequently, the invention enables a powerful level to be used to drive a plasma that heretofore would have been deemed "too low." As such, a remote plasma source can be more flexibly utilized to produce plasma at power levels that were heretofore unavailable for processing semiconductor wafers.

BRIEF DESCRIPTION OF THE DRAWINGS

The following detailed description will be more fully understood with reference to the accompanying drawings, in which:

FIG. 2 depicts the appropriated alignment of FIGS. 2A and 2B; and FIGS. 2A and 2B together depict a flow diagram of a software implementation of the present invention.

To facilitate understanding, identical reference numerals have been used, where possible, to designate identical elements that are common to the figures.

DETAILED DESCRIPTION

Figure 1:
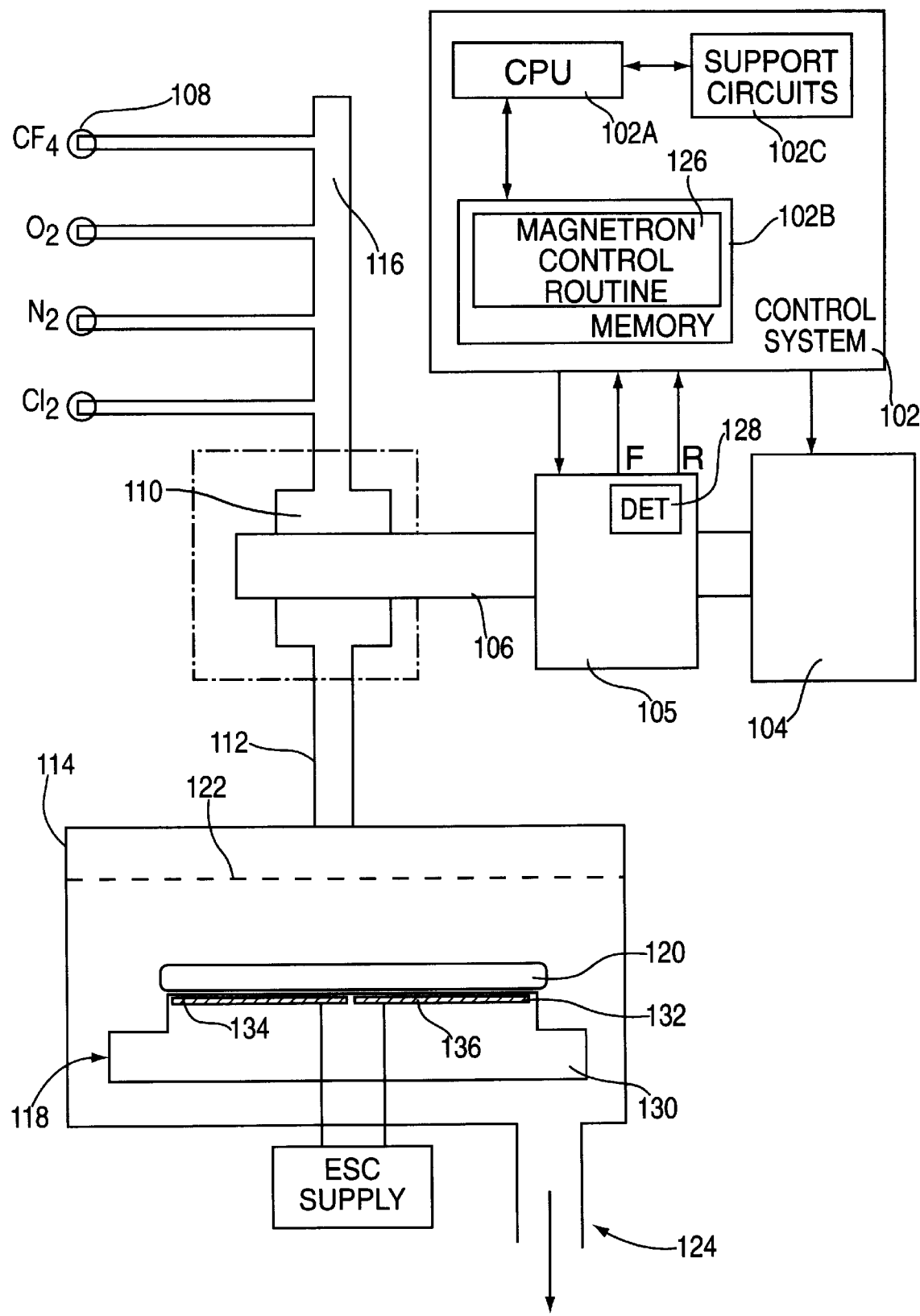
FIG. 1 depicts a schematic diagram of a remote plasma source semiconductor wafer processing system that operates in accordance with the present invention.

FIG. 1 depicts a block diagram of a dry etch system 100, such as Model P5000 RPS chamber manufactured by Applied Materials, Inc. of Santa Clara, Calif., which employs the present invention. The system 100 contains a process chamber 114, an applicator 110, a magnetron generator 104, a tuner 105, a process gas supply 108 and a control system 102. The etch process occurs in the process chamber 114, where the wafer 120 is exposed to the plasma gas. The plasma gas is supplied to the process chamber 114 by the applicator 110 through transport conduit 112. Within the applicator 110, a process gas (or combination of process gases) is exposed to an electromagnetic field, having a frequency that is approximately 2.5 GHz. The specific frequency used depends upon the process recipe used to etch, or otherwise process the wafer. The microwave energy is coupled from the magnetron 104, through tuner 105 and waveguide 106 to the applicator 110. Exposure of the process gas to the electromagnetic fields converts the process gas into a plasmatic state. The process gas, which may comprise one or more gases such as $Cl_2$, $O_2$, $N_4$, $CF_3$, $NF_3$, $CHF_3$, $CH_3F$, $CH_2F_2$, $C_4F_8$, $H_2O$, $CH_3OH$, $CH_3COOH$, and $SF_6$, is supplied to the applicator 110 by a plurality process gas sources 108.

Reactive species produced within the plasma are directed out of an open end of the applicator 110 through the transport conduit 112. Specifically, the reactive species are directed to the process chamber 114 via a negative pressure within the chamber 114. A gas diffusion plate 122 is typically used to spread the plasma to provide a uniform distribution of the reactive species within the process chamber 114, thereby promoting uniform wafer processing. The reactive species are directed towards a workpiece, typically a semiconductor wafer 120, that is supported within the chamber 114 upon a pedestal 118. The pedestal contains a cathode 130 containing or otherwise supporting an electrostatic chuck 132. The cathode 130 is generally connected to ground.

The electrostatic chuck 132 is either a portion of the cathode 130 or is mounted to the cathode. The chuck contains one or more electrodes (two electrodes 134 and 136 are depicted) that are imbedded in a dielectric material, (e.g., aluminum-nitride ceramic, boron-nitride ceramic, polyimide, and the like). The wafer is retained upon the surface of the chuck via an electrostatic force between the chuck and the wafer.

The reactive species are exhausted from the process chamber through an exhaust port 124. The exhaust port 124 is generally coupled to one or more vacuum pumps (not shown) that maintain a negative pressure (a partial vacuum) in the chamber.

The electromagnetic field is generated by a magnetron generator 104 which, in the preferred embodiment, is a commercially available generator comprising, for example, a model SGM-15B magnetron coupled to a model SMA-15B tuner and powered by a SGP-15B power supply, all of which is manufactured by Daihen. This magnetron generator is capable of producing electromagnetic energy at approximately 1500 watts at a frequency approximately 2.54 GHz.

The generator 104 is coupled to a tuner 105 that selects a particular frequency to couple to the applicator 110 and provides impedance matching between the magnetron 104 and the waveguide 106. The waveguide 106 transmits the electromagnetic energy to the applicator 110. This particular magnetron is controlled by digital signals, and a system controller 102 is used to generate these control signals. Specifically, the system controller 102 produces digital commands for the tuner 105 and generator 104 using a standard communication protocol such as RS-232. The tuner further contains a directional coupler and associated RF detectors that are represented by detector 128. The coupler and detectors produce signals representing the magnitude of the forward power F and the reflected power R.

The system controller 102 comprises a central processing unit (CPU) 102A, a memory 102B and support circuitry 102C (e.g., well-known circuitry such as cache memory, power supplies, clocks, and the like). The CPU 102A executes program instructions to generate the signals necessary for controlling the magnetron generator 104. The CPU 102A is a general purpose processor such as a model 68000 or some other generally available processor that, when executing the routines of the present invention, becomes a specific purpose processor. In the preferred embodiment, the system controller 102 is implemented using a model 680X0 processor manufactured by Motorola, Inc. that is installed on a computer card (system controller 102) with 4 to 6 megabytes of memory 126 and assorted support circuits. The computer card is manufactured by Synergy, Inc.

Although the invention is described herein as implemented as a software routine 126 executed upon a general purpose computer, the invention can also be implemented in hardware as an application specific integrated circuit (ASIC) or as discrete components. Furthermore, the invention can also be implemented using a combination of hardware and software such that portions of the inventive routines are performed by hardware and other portions are performed by software executing on a microprocessor. From this detailed disclosure, those skilled in the art will be able to implement the invention in any of these various forms. Consequently, the invention should be interpreted as encompassing any implementation including hardware, software or both.

When the process chamber 114 requires a plasma, the process gas source 108 supplies process gas to the applicator 110 via a conduit 116. The magnetron generator 104 is then activated to supply the electromagnetic power to convert the process gas into a plasma.

Figure 2B:
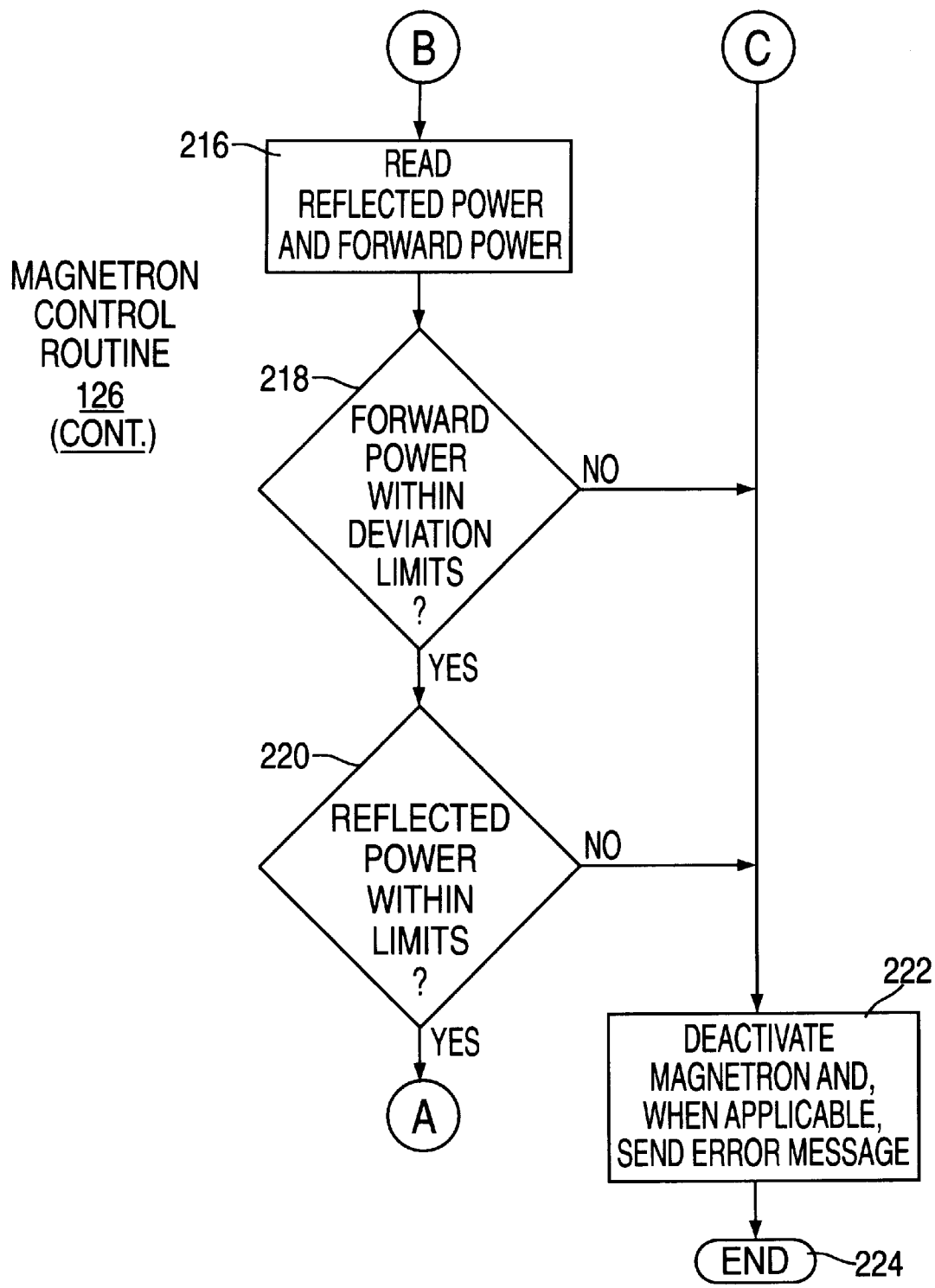

FIG. 2 depicts a flow diagram of a magnetron control routine 126 of the present invention. It is assumed that, prior to executing this routine, a wafer has been positioned on the electrostatic chuck and chucked to retain the wafer in a stationary position within the chamber. Additionally, it is assumed that, prior to executing the magnetron control routine, the process gas has been supplied to the applicator. The routine 126 begins in step 200, and proceeds to step 202 where the power to the magnetron generator is turned on. A flag is set within a register to indicate that the magnetron has been activated. Then, in step 204, a check is made to determine if a fault has occurred, such as an improper level of coolant, gas, or any number of conditions which would call for aborting the current process recipe. These faults are logged in one or more fault flag registers that are monitored by the routine 126. If such a fault has occurred, then the routine 126 moves to step 222, where the routine deactivates the magnetron and sends an error message. The routine ends at step 224. Other, higher level routines handle notifying the user of the fault. These higher level routines do not form any part of the present invention. If a fault is not detected, a second check is made, in step 206, to determine if the magnetron generator has been instructed to turn off (deactivate) (i.e., another interrupt routine may instruct the magnetron to deactivate). If no such instruction has been issued, the routine continues to step 208.

If the routine has been ended at step 224 due to occurrence of a fault or some other reason, the routine will not start again until certain fault reset procedures are accomplished. These procedures generally require an operator to perform certain tasks to ensure that the system hardware will not be damaged upon restarting the routine. Such reset procedures do not form part of this invention.

At step 208, the requested power is compared with the ignition power level. The ignition power level is a value that is chosen based on the physical limitations of the process chamber 114, i.e., it is the power level that safely and effectively produces a plasma within the applicator. In the preferred embodiment, the ignition level is adjustable from a minimum of zero watts to a maximum of 1500 watts, and a default value of 350 watts. If the requested power is less than the ignition level, the routine continues in step 210, where the process recipe is allowed to begin. However, the process recipe will initially use a power level only as low as the ignition power level. Then, in step 212, the output power level from the magnetron is decreased to the level of the requested power. Generally, the decrease is a linear function, but it may be a function other than linear. This is accomplished within a specified ramp down time, which ranges, in the preferred embodiment, from 0 to 100 seconds, with a default time of 200 milliseconds. As the power level control signal is decreased, the output power generated by the magnetron generator also decreases.

More specifically, the output power is incrementally decreased with each pass through the routine (i.e., the polling interval). Each decrement in the power level per polling interval is computed as a "ramp rate", where the ramp rate (in watts per polling interval) is $$\frac{(RPL - IPL)P}{R}$$

where:
RPL=requested power level (watts);
IPL=ignition power level (watts);
P=polling interval (mS);

R=ramp down time (mS).

The polling interval is the time between passes through the magnetron control routine, e.g., 100 mS. The ramp down time is a variable that depends on the process parameters and has a default value of, for example, 200 mS. The power level decrement is limited such that if the next decrement would cause the output power of the magnetron to be less than the requested power level, the magnetron output power is set to the requested power level.

If the requested power, in step 208, is greater than or equal to the ignition power level, then the process recipe is allowed to continue, in step 214, using the requested power level. No adjustment of the power level is necessary.

Generally, the forward and reflected power coupled to the applicator is measured at the directional coupler within the tuner. Numbers representing the magnitude of forward and reflected power are stored in the control system. The routine 126, at step 216, reads the values of forward and reflected power.

At step 218, the forward power value is subtracted from the requested power level to compute a deviation value. The deviation value is compared to a predetermined forward power deviation limit. The deviation limit is a measure of the maximum allowable difference between the requested power level and the measured forward power. The deviation limit is predefined as, for example, 20 watts. If the deviation value exceeds the predetermined forward power deviation limit, the routine proceeds directly to step 222, deactivates the magnetron, sends an error message, and ends the routine. The routine will not begin again until a reset process is completed (not shown).

If the forward power is within the deviation limit, a second check is performed, in step 220 to determine whether the reflected power is within a predetermined reflected power limit range. Reflected power is power supplied by the magnetron generator that is not coupled to the applicator but is reflected from the applicator. The reflected power results from an impedance mismatch between the magnetron and the applicator. In the present embodiment, reflected power is directly measured using the directional coupler. In the preferred embodiment, a reflected power limit is established at 10% of the power supplied by the magnetron generator. Thus, in step 220, if the forward power is less than 90% of the power supplied by the magnetron generator, this is considered an error condition and the routine proceeds to step 222. The reflected power limit may also be a constant value, such as 10 watts, that can be changed depending upon the process being performed in the chamber.

The routine loops through path A every 100 mS. If the requested power has not changed, the routine merely continues looping until a change is requested and a new power level command is sent to the magnetron, or a fault is detected in either of steps 204, 206, 218 or 220.

With the use of this invention, the power used in the applicator may be set to a level that heretofore was not available for wafer processing. As such, the invention provides improved flexibility in wafer processing recipes. Although various embodiments which incorporate the teachings of the present invention have been shown and described in detail herein, those skilled in the art can readily devise many other varied embodiments that still incorporate these teachings.

What is claimed is:

1. A method for activating a magnetron generator in a semiconductor wafer processing system comprising the steps of:

receiving, from a process controller, a request for a requested power level that is to be supplied by said magnetron generator, where said requested power level is less than a predefined ignition level;

instructing said magnetron generator to begin supplying electromagnetic energy at an output power level corresponding to said predefined ignition level; and decreasing said output power level to said requested power level.

2. The method of claim 1 wherein said output power level is decreased over a predefined period of time.

3. The method of claim 1 further comprising the steps of determining the forward power delivered to an applicator and, if said forward power is not within predefined deviation limits, deactivating said magnetron generator.

4. The method of claim 1 further comprising the steps of determining the reflected power reflected by an applicator and, if said reflected power is not within predefined limits, deactivating said magnetron generator.

5. The method of claim 1, further comprising the steps of:

detecting the amount of forward power transmitted to an applicator by said magnetron generator;

determining the amount of reflected power that is supplied by said magnetron generator and reflected from said applicator;

comparing said reflected power level with a predetermined reflected power limit;

comparing said forward power level with a predetermined forward power deviation limit; and deactivating said magnetron generator if said reflected ower level exceeds said predetermined reflected power limit, or if said forward power level exceeds said predetermined forward power deviation limit.

6. The method of claim 5 wherein said deviation limit is a maximum allowable difference between the requested power level and the forward power level.

7. A method for activating a magnetron generator in a semiconductor wafer processing system comprising the steps of:

receiving, from a process controller, a request for a requested power level that is to be supplied by said magnetron generator, where said requested power level is less than a predefined ignition level;

instructing said magnetron generator to begin supplying electromagnetic energy at an output power level corresponding to said predefined ignition level; and decreasing said output power level to said requested power level;

detecting the amount of forward power transmitted to an applicator by said magnetron generator;

detecting the amount of reflected power that is supplied by said magnetron generator and reflected by said applicator;

comparing said reflected power level with a predetermined reflected power limit;

comparing said forward power level with a predetermined forward power deviation limit; and deactivating said magnetron generator if said reflected power level exceeds said predetermined reflected power limit, or if said forward power level exceeds said predetermined forward power deviation limit.

8. The method of claim 7 wherein said deviation limit is a maximum allowable difference between the requested power level and the forward power level.

9. A computer readable medium containing an executable program for activating a magnetron generator in a semiconductor wafer processing system, where the program causes the semiconductor wafer processing system to perform the steps of:

receiving a request for a requested power level that is to be supplied by said magnetron generator, where said requested power level is less than a predefined ignition level;

instructing said magnetron generator to begin supplying electromagnetic energy at an output power level corresponding to said predefined ignition level; and decreasing said output power level to said requested power level.

10. The computer readable medium of claim 9 wherein said executable program further causes the semiconductor wafer processing system to decrease the output power level over a predefined period of time.

11. The computer readable medium of claim 9, wherein said executable program further causes the semiconductor wafer processing system to perform the steps of:

determining the forward power delivered to an applicator and, if said forward power is not within predefined deviation limits, deactivating said magnetron generator.

12. The computer readable medium of claim 9, wherein said executable program further causes the semiconductor wafer processing system to perform the steps of:

determining the reflected power reflected by an applicator and, if said reflected power is not within predefined limits, deactivating said magnetron generator.

13. The computer readable medium of claim 9, wherein said executable program further causes the semiconductor wafer processing system to perform the steps of:

detecting the amount of forward power transmitted to an applicator by said magnetron generator;

detecting the amount of reflected power that is supplied by said magnetron generator and reflected from said applicator;

comparing said reflected power level with a predetermined reflected power limit;

comparing said forward power level with a predetermined forward power deviation limit; and deactivating said magnetron generator if said reflected power level exceeds said predetermined reflected power limit, or if said forward power level exceeds said predetermined forward power limit.

\* \* \* \* \*

UNITED STATES PATENT AND TRADEMARK OFFICE
CERTIFICATE OF CORRECTION

PATENT NO : 6,144,894

DATED : November 7, 2000

INVENTOR(S) : Tam Nguyen

It is certified that error appears in the above-identified patent and that said Letters Patent are hereby corrected as shown below:

claim 5: column 6, line 32 change "ower" to --power--;

claim 7: column 6, line 48 delete --"and"--.

Signed and Sealed this

Eighth Day of May, 2001

*Attest:*

NICHOLAS P. GODICI

*Attesting Officer*     *Acting Director of the United States Patent and Trademark Office*